United States Patent
Usami et al.

(10) Patent No.: US 10,395,933 B2
(45) Date of Patent: Aug. 27, 2019

(54) METHOD FOR MANUFACTURING SEMICONDUCTOR WAFER

(71) Applicant: SHIN-ETSU HANDOTAI CO., LTD., Tokyo (JP)

(72) Inventors: Yoshihiro Usami, Nishigo-mura (JP); Shiro Amagai, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/748,834

(22) PCT Filed: Jul. 15, 2016

(86) PCT No.: PCT/JP2016/003339
§ 371 (c)(1),
(2) Date: Jan. 30, 2018

(87) PCT Pub. No.: WO2017/026092
PCT Pub. Date: Feb. 16, 2017

(65) Prior Publication Data
US 2018/0226258 A1    Aug. 9, 2018

(30) Foreign Application Priority Data
Aug. 7, 2015    (JP) .................................. 2015-157347

(51) Int. Cl.
*H01L 21/302*    (2006.01)
*H01L 21/304*    (2006.01)
(Continued)

(52) U.S. Cl.
CPC ...... *H01L 21/304* (2013.01); *H01L 21/02021* (2013.01); *H01L 21/02024* (2013.01);
(Continued)

(58) Field of Classification Search
CPC ......... B06B 1/0688; G06F 2203/04103; G06F 3/016; G06F 3/041; G06F 3/0414;
(Continued)

(56) References Cited

U.S. PATENT DOCUMENTS 9,412,706 B1 *    8/2016   Abdelnaby ........... H01L 23/562
2003/0170920 A1 *  9/2003  S. Bhagavat ......... B24B 37/005
                                                       438/14
(Continued)

FOREIGN PATENT DOCUMENTS

JP    H06-112120 A    4/1994
JP    2008-078474 A   4/2008
(Continued)

OTHER PUBLICATIONS

Sep. 20, 2016 Search Report issued in International Patent Application No. PCT/JP2016/003339.

*Primary Examiner* — Lan Vinh
(74) *Attorney, Agent, or Firm* — Oliff PLC

(57) ABSTRACT

A method for manufacturing a semiconductor wafer including: slicing off a plurality of wafers from an ingot; chamfering outer peripheral portions of the plurality of sliced wafers; and performing double-side polishing to polish both surfaces of each wafer whose outer peripheral portion is held by a carrier, wherein includes performing warp direction adjustment to uniform directions of warps of the plurality of wafers in one direction after the slicing and before the chamfering, and the chamfering and the double-side polishing are performed in a state where the directions of the warps of the plurality of wafers are uniformed in one direction after the warp direction adjustment. Consequently, it is possible to provide the method for manufacturing a semiconductor wafer which can suppress degradation of flatness of the double-side polished wafers even in case of uniforming the (Continued)

directions of the warps of the wafers in one direction before the double-side polishing.

1 Claim, 2 Drawing Sheets

(51) Int. Cl.
   *H01L 21/02* (2006.01)
   *H01L 21/67* (2006.01)
   *H01L 21/321* (2006.01)
(52) U.S. Cl.
   CPC .. H01L 21/67282 (2013.01); H01L 21/67288 (2013.01); *H01L 21/3212* (2013.01)
(58) Field of Classification Search
   CPC ........... H01L 21/0337; H01L 21/31053; H01L 21/31116; H01L 41/053; H01L 41/081; H01L 21/02021; H01L 21/02024; H01L 21/304; H01L 21/67282; H01L 21/67288; H01L 21/30625; H01L 21/3212; H01L 21/31155; B02C 23/02; B02C 7/11; B02C 7/12; B02C 7/14; D21B 1/36; D21D 1/30
   USPC ....... 438/692, 693, 706, 710, 712, 714, 717, 438/719, 723, 736, 694; 216/40, 41
   See application file for complete search history.

(56) References Cited

U.S. PATENT DOCUMENTS

2007/0119817 A1\* 5/2007 Koyata ............ H01L 21/02019 216/88
2009/0288530 A1 11/2009 Oishi et al.

FOREIGN PATENT DOCUMENTS

| JP | 2008-140856 A | 6/2008 |
| JP | 2010-010358 A | 1/2010 |

\* cited by examiner

METHOD FOR MANUFACTURING SEMICONDUCTOR WAFER

TECHNICAL FIELD

The present invention relates to a method for manufacturing a semiconductor wafer.

BACKGROUND ART

In conventional examples, each of semiconductor wafers such as silicon wafers is manufactured by slicing a silicon ingot to fabricate wafers and then performing respective processes, e.g., chamfering, lapping, etching, polishing, cleaning, and the like. Further, to eliminate defects on a wafer surface where a device is formed, for example, a technology to grow an epitaxial layer on a surface of each wafer by a vapor phase epitaxial growth method is used (see Patent Literature 1).

However, in case of growing an epitaxial layer on a silicon wafer, in a relationship between the silicon wafer and the epitaxial layer, when their dopant concentrations are different from each other, lattice constants of atoms constituting these members are not the same. Thus, it is known that the silicon wafer having an epitaxially grown surface is apt to warp.

As a countermeasure, in at least one of grinding and polishing, a method to perform processing so that a bowl-like dent is formed at a central portion of the silicon wafer and to thereby warp the wafer is used (see Patent Literature 2). Since adopting such a method enables canceling out stress caused due to a dopant concentration difference between the silicon wafer and the epitaxial layer by using the warp produced in the grinding or the like, and hence generation of a large warp of an epitaxial wafer can be suppressed.

CITATION LIST

Patent Literatures

Patent Literature 1: Japanese Unexamined Patent Application Publication No. Hei 6-112120
Patent Literature 2: Japanese Unexamined Patent Application Publication No. 2008-140856

DISCLOSURE OF INVENTION

Problem to be Solved by the Invention

However, the method disclosed in Patent Literature 2 can only cope with the grinding or the polishing where one surface of the wafer is held by using a single-side adsorption mechanism. Thus, even a semiconductor manufacturing method which has a process such as double-side polishing to polish both surfaces of the wafer without having the single-side adsorption mechanism requires a technology to suppress generation of a large warp after the epitaxial growth.

Thus, there has been devised a method for measuring directions of warps of wafers, reversing the wafers as required before forming a laser mark which determines a front or back side or before the double-side polishing so that the directions of the warps become uniform, and then growing an epitaxial layer. In case of an epitaxial growth wafer, the directions of the warps of the wafers can be set to a downwardly protruding direction. However, when the wafer reversed to uniform the direction of the warp is subjected to the double-side polishing using a carrier, there arises a problem that flatness is degraded. Further, to avoid such degradation of the flatness in the double-side polishing, a method for uniforming the directions of the warps of the wafers after the double-side polishing and then forming a laser mark can be considered, but the flatness of the wafer is degraded due to debris produced due to the laser mark.

In view of such a problem as described above, it is an object of the present invention to provide a method for manufacturing a semiconductor wafer, which can suppress the degradation of flatness of a wafer after the double-side polishing even in case of uniforming directions of warps of the wafers to one direction before the double-side polishing process.

Means for Solving Problem

To achieve the object, the present invention provides a method for manufacturing a semiconductor wafer including: slicing off a plurality of wafers from an ingot; chamfering outer peripheral portions of the plurality of sliced wafers; and holding the plurality of chamfered wafers by using a carrier which holds the outer peripheral portions of the wafers and performing double-side polishing to polish both surfaces of each wafer whose outer peripheral portion is held by the carrier, the method being characterized in that the method includes performing warp direction adjustment to uniform directions of warps of the plurality of wafers in one direction after the slicing and before the chamfering, and the chamfering and the double-side polishing are performed in a state where the directions of the warps of the plurality of wafers are uniformed in one direction after the warp direction adjustment.

As described above, when the directions of the warps of the plurality of wafers are uniformed in one direction after the slicing and before the chamfering, it is possible to suppress the degradation of flatness of the wafers, which have been subjected to the double-side polishing, in the double-side polishing.

At this time, in the warp direction adjustment, the directions of the warps of the plurality of wafers are determined, and some of the plurality of wafers are reversed based on a result of the determination, thus the directions of the warps of the plurality of wafers can be uniformed in one direction.

More specifically, in the warp direction adjustment, the warps of the plurality of wafers can be uniformed in one direction.

Effect of the Invention

According to the method for manufacturing a semiconductor wafer of the present invention, even in case of uniforming the warps of the wafers in one direction before the double-side polishing, the degradation of flatness of the wafers subjected to the double-side polishing can be suppressed.

DETAILED DESCRIPTION OF THE PREFERRED EMBODIMENTS

Although an embodiment of the present invention will now be described hereinafter, the present invention is not restricted thereto.

As described above, to uniform warps of wafers in one direction, when double-side polishing using a carrier was applied to each wafer reversed before laser marking, considerable degradation of flatness was observed in some situations. Thus, the present inventors paid attention to a shape of an end surface of each wafer, and conducted various experiments.

As a result, the present inventors have found out that engagement of chamfered shapes, which are vertically asymmetric due to a difference in removal stock between an upper part and a lower part of a wafer end portion, and a shape of an end surface of a carrier coming into contact with the wafer had changed due to reversing the wafer before double-side polishing. Further, they have also found that this change in engagement leads to degradation of flatness of the wafer in the double-side polishing. Thus, the present inventors have discovered that uniforming directions of wafers in one direction before chamfering enables suppressing the degradation of the flatness after the double-side polishing, thereby bringing the present invention to completion.

Figure 1:
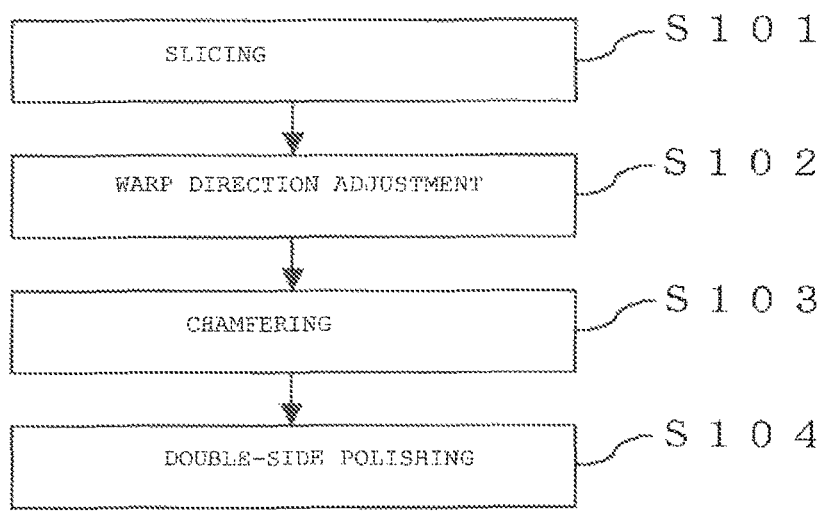
FIG. 1 is a flowchart showing an example of a method for manufacturing a semiconductor wafer according to the present invention.

The method for manufacturing a semiconductor wafer according to the present invention will now be described hereinafter with reference to FIGS. 1 and 2. As shown in FIG. 1, the method for manufacturing a semiconductor wafer according to the present invention includes at least slicing to slice off a plurality of wafers from an ingot (S101 in FIG. 1), warp direction adjustment to uniform directions of warps of the plurality of wafers in one direction (S102 in FIG. 1), chamfering to chamfer outer peripheral portions of the plurality of wafers (S103 in FIG. 1), and double-side polishing to polish both surfaces of each wafer (S104 in FIG. 1).

First, the slicing is performed (S101 in FIG. 1). In this process, an ingot such as a silicon ingot is sliced into a plurality of wafers. The slicing can be performed by using a wire saw. When the ingot is sliced by using the wire saw, wafers having warps in opposite directions are produced at both ends of the ingot due to an influence of grooved rollers forming a wire row, the ingot itself, thermal expansion of each portion, and the like. It is to be noted that a slicing apparatus which can be used in the present invention is not restricted to the wire saw. Besides the wire saw, a slicing apparatus including an inner diameter slicer or a band saw can be used.

Subsequently, after the slicing (S101 in FIG. 1) and before the chamfering (S103 in FIG. 1), the warp direction adjustment (S102 in FIG. 1) is performed. In the warp direction adjustment, directions of warps of the plurality of wafers can be uniformed in one direction by, e.g., the following method.

First, the directions of the warps of the plurality of wafers are determined. The direction of the warp of each wafer can be evaluated by using Bow as an index. Bow is a numerical value of a displacement amount from a reference point at a wafer center to a central surface at a wafer middle point. A warp of the wafer can be determined to protrude downward when Bow has a negative value, and the warp of the wafer can be determined to protrude upward when Bow has a positive value. In the measurement of Bow, a measurement apparatus such as SBW-33 (manufactured by Kobelco Research Institute Inc.) can be used.

Next, when some of the plurality of wafers are reversed based on determination results of the warps of the plurality of wafers, the directions of the warps of the plurality of wafers are uniformed in one direction. At this time, the directions of the warps of the plurality of wafers can be uniformed in any one of a downwardly protruding direction and an upwardly protruding direction. A wafer reversing operation can be carried out by using a reversal mechanism attached to the measurement apparatus, e.g., SBW-330.

After execution of the warp direction adjustment, the chamfering (S103 in FIG. 1) is performed. According to the method for manufacturing a semiconductor wafer of the present invention, in this chamfering, in a state where the directions of the warps of the plurality of wafers are uniformed in one direction, outer peripheral portions of the wafers are chamfered.

After execution of the chamfering, the double-side polishing is performed (S104 in FIG. 1). According to the method for manufacturing a semiconductor wafer of the present invention, in the double-side polishing, likewise, both surfaces of each wafer are polished in a state where the directions of the warps of the plurality of wafers are uniformed in one direction. In the double-side polishing, for example, such a double-side polishing apparatus as shown in FIG. 2 can be used.

Figure 2:
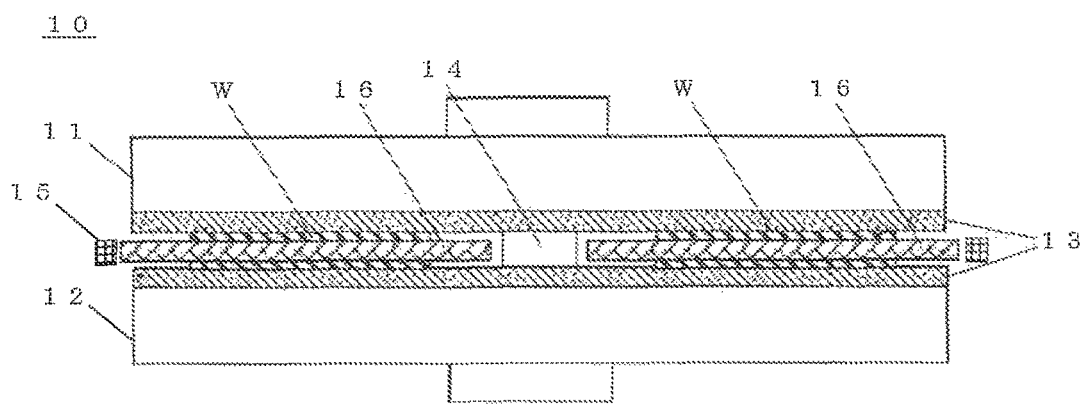
FIG. 2 is a schematic view showing an example of a double-side polishing apparatus which can be used in double-side polishing in the method for manufacturing a semiconductor wafer according to the present invention.

As shown in FIG. 2, the double-side polishing apparatus 10 includes an upper turntable 11 and a lower turn table 12 which are provided to vertically face each other, and a polishing pad 13 is attached to each of the turn tables 11 and 12. A sun gear 14 is provided at a central portion between the upper turntable 11 and the lower turntable 12, and an annular internal gear 15 is provided at a peripheral edge portion between the same. When each wafer W is inserted into a holding hole of a carrier 16, its outer peripheral portion is held, and the wafer W is sandwiched between the upper turntable 11 and the lower turntable 12.

Further, outer peripheral teeth of the carrier 16 mesh with respective tooth portions of the sun gear 14 and the internal gear 15, and the carrier 16 revolves around the sun gear 14 while rotating on its own axis as the upper turntable 11 and the lower turntable 12 are rotated by a driving source. At this time, both surfaces of each wafer W, whose outer peripheral portion is held in the holding hole of the carrier 16, are simultaneously polished when the wafer W is rubbed by the upper and lower polishing pads 13. It is to be noted that, at the time of polishing each wafer W, slurry is supplied to the wafer W from a non-illustrated nozzle.

In the present invention, before performing the chamfering, the warp directions of the plurality of wafers are uniformed in one direction. Thus, in the double-side polishing which is performed while holding the outer peripheral portion of each wafer W by the carrier 16, engagement of a chamfered shape of each wafer and an end surface shape of the carrier coming into contact with the wafer (a shape of an inner peripheral surface of each holding hole of the carrier 16 in the polishing apparatus 10 in FIG. 2) is the same in the respective wafers. Thus, even in case of uniforming the warp directions of the wafers in one direction, degradation of flatness of the wafers due to the double-side polishing can be suppressed.

It is to be noted that the method for manufacturing a semiconductor wafer according to the present invention may include any other process generally adopted in manufacture of semiconductor wafers than the slicing, the warp direction adjustment, the chamfering, and the double-side polishing. For example, the method may include lapping to flatten each chamfered wafer, etching to remove damage caused due to the lapping, laser marking to perform marking by applying laser to a surface of each wafer in the double-side polishing, and the like.

EXAMPLES

Although the present invention will be more specifically described hereinafter with reference to an example and a comparative example of the present invention, the present invention is not restricted the examples.

Example

Semiconductor wafers were manufactured based on the method for manufacturing a semiconductor wafer according to the present invention. In Example, the slicing, the warp direction adjustment, the chamfering, the lapping, the laser making, and the double-side polishing were performed in this order.

In the slicing, in both Example and later-described Comparative Example, a silicon ingot with a diameter of 300 mm manufactured by a CZ method (a Czochralski method) was sliced by using a wire saw to fabricate wafers.

In the warp direction adjustment, directions of warps were uniformed in such a manner that they become a downwardly protruding direction in all the wafers. At this time, a value of Bow of each wafer was measured by SBW-330 to determine a direction of the warp. Furthermore, each wafer which warps in an upwardly protruding direction is reversed by using the reversing mechanism attached to SBW-330 so that the directions of warps of the wafers are uniformed in the downwardly protruding direction.

In Example, the chamfering and the double-side polishing were performed in a state where the directions of the warps of the plurality of wafers are uniformed in one direction in such a manner.

After completion of the double-side polishing, to evaluate flatness of each wafer, which was reversed in the warp direction adjustment, after the double-side polishing, SFQR (Site front surface referenced least squares range) was measured. SFQR is a range of positive and negative deviations from a reference surface which is provided by determining a cell having an arbitrary dimension on the surface and performing a least squares method to a surface of this cell. Moreover, in the SFQR measurement, Wafer Sight (manufactured by KLA-TENCOR) was used.

Figure 3:
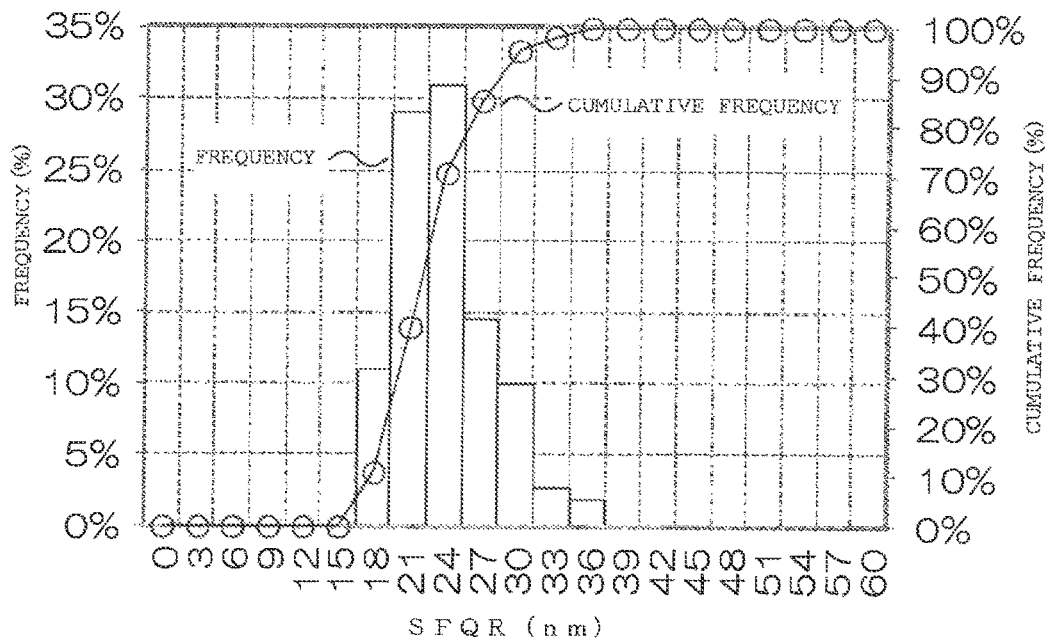
FIG. 3 is a graph showing a measurement result of SFQR of wafers after double-side polishing in an example.

FIG. 3 shows a measurement result of SFQR according to Example. As shown in FIG. 3, a percentage of wafers having SFQR=21 to 24 nm is highest, and this percentage exceeds 30%. Additionally, a cumulative frequency reaches 100% before SFQR=36 nm is attained. These results have revealed that the method for manufacturing a semiconductor wafer according to the present invention by which the directions of the warps of the wafers are uniformed in one direction before the chamfering enables suppressing degradation of the flatness in the double-side polishing and providing the semiconductor wafers with the excellent flatness at a high rate.

Comparative Example

Semiconductor wafers were manufactured under the same conditions except that an order of the respective manufacturing processes in manufacture of the semiconductor wafers was set to an order of the slicing, the chamfering, the warp direction adjustment, the lapping, the laser marking, and the double-side polishing, i.e., except that the warp direction adjustment was performed after the chamfering. Further, SFQR of each wafer, which was reversed in the warp direction adjustment, after the double-side polishing was measured by the same method as that of Example.

Figure 4:
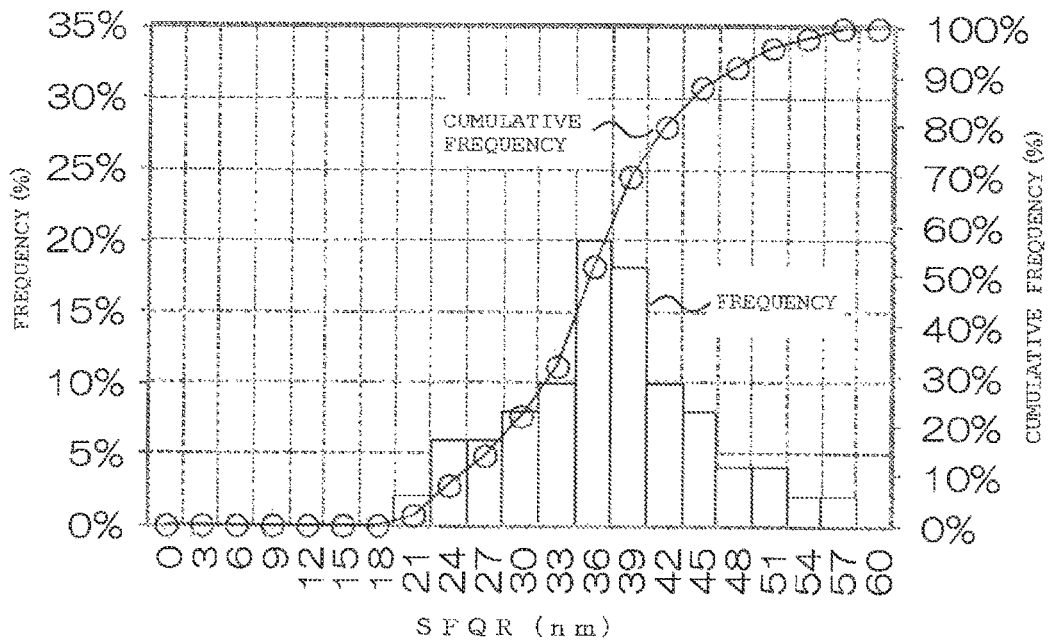
FIG. 4 is a graph showing a measurement result of SFQR of wafers after double-side polishing in a comparative example.

FIG. 4 shows a measurement result of SFQR according to Comparative Example. A percentage of wafers having SFQR=33 to 36 nm is highest, and this percentages is 20%. Furthermore, a cumulative frequency eventually reaches 100% when SFQR=60 nm is attained. As described above, in Comparative Example, a percentage of the semiconductor wafers having degraded flatness is higher than that of Example.

It is to be noted that the present invention is not restricted to the embodiment. The embodiment is an illustrative example, and any example which has substantially the same structure and exerts the same functions and effect as the technical concept described in claims of the present invention is included in the technical scope of the present invention.

The invention claimed is:

1. A method for manufacturing a semiconductor wafer comprising:
    slicing off a plurality of wafers from an ingot;
    chamfering outer peripheral portions of the plurality of sliced wafers; and
    holding the plurality of chamfered wafers by using a carrier which holds the outer peripheral portions of the wafers and performing double-side polishing to polish both surfaces of each wafer whose outer peripheral portion is held by the carrier,
    wherein the method comprises performing warp direction adjustment to uniform directions of warps of the plurality of wafers in one direction after the slicing and before the chamfering,
    the chamfering and the double-side polishing are performed in a state where the directions of the warps of the plurality of wafers are uniformed in one direction after the warp direction adjustment, and
    in the warp direction adjustment, the directions of the warps of the plurality of wafers are determined, and some of the plurality of wafers are reversed based on a result of the determination, thus the directions of the warps of the plurality of wafers are uniformed in one direction.

* * * * *